United States Patent
Lee et al.

(10) Patent No.: US 10,485,105 B2
(45) Date of Patent: Nov. 19, 2019

(54) SUBSTRATE AND METHOD FOR MANUFACTURING THE SAME

(71) Applicant: SAMSUNG ELECTRO-MECHANICS CO., LTD., Suwon-si, Gyeonggi-do (KR)

(72) Inventors: Yong Sam Lee, Suwon-si (KR); Won Joong Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/712,787

(22) Filed: Sep. 22, 2017

(65) Prior Publication Data
US 2018/0242453 A1    Aug. 23, 2018

(30) Foreign Application Priority Data
Feb. 17, 2017   (KR) .................. 10-2017-0021721

(51) Int. Cl.
| | | |
|---|---|---|
| H05K 1/11 | (2006.01) | |
| H05K 3/00 | (2006.01) | |
| H05K 3/42 | (2006.01) | |

(52) U.S. Cl.
CPC .............. H05K 1/115 (2013.01); H05K 1/111 (2013.01); H05K 1/112 (2013.01); H05K 3/0038 (2013.01);
(Continued)

(58) Field of Classification Search
CPC .... H05K 1/115; H05K 3/0094; H05K 3/0038; H05K 1/11; H05K 1/111; H05K 1/112; H05K 1/113; H05K 1/116; H05K 2201/09372; H05K 2201/09454; H05K 2201/09481; H05K 2201/0949; H05K 2201/095; H05K 2201/09509; H05K 2201/0959; H05K 2201/09563; H05K 2201/09572; H05K 2201/09827
See application file for complete search history.

(56) References Cited

U.S. PATENT DOCUMENTS

| | | | | |
|---|---|---|---|---|
| 6,000,130 A | * | 12/1999 | Chang | .................. H01L 23/50 |
| | | | | 257/E23.079 |
| 7,243,425 B2 | * | 7/2007 | Hirata | ................ H05K 3/0008 |
| | | | | 29/825 |

(Continued)

FOREIGN PATENT DOCUMENTS

| | | |
|---|---|---|
| JP | 2001-313471 A | 11/2001 |
| JP | 2005-191115 A | 7/2005 |

(Continued)

OTHER PUBLICATIONS

Korean Office Action dated Mar. 21, 2018 issued in Korean Patent Application No. 10-2017-0021721 (with English translation).

*Primary Examiner* — Ishwarbhai B Patel
(74) *Attorney, Agent, or Firm* — Morgan, Lewis & Bockius LLP

(57) ABSTRACT

A substrate including a through hole only in one of a direction from a top surface to a bottom surface of the substrate or a direction from a bottom surface to a top surface of the substrate, a protruding portion of a metal layer protruding toward the through hole being removed, and a plating layer on an inner surface of the substrate on at least the through hole.

10 Claims, 8 Drawing Sheets

(52) U.S. Cl.
CPC ........... *H05K 3/0094* (2013.01); *H05K 1/113* (2013.01); *H05K 3/0055* (2013.01); *H05K 3/427* (2013.01)

(56) References Cited

U.S. PATENT DOCUMENTS

| | | | | |
|---|---|---|---|---|
| 2006/0289203 | A1* | 12/2006 | Oda | H01L 21/486 174/264 |
| 2007/0263370 | A1* | 11/2007 | Niki | H05K 1/115 361/783 |
| 2009/0283315 | A1* | 11/2009 | Lee | H05K 3/421 174/262 |
| 2013/0326874 | A1* | 12/2013 | Ueki | H05K 3/423 29/852 |
| 2014/0332258 | A1* | 11/2014 | Uchida | H05K 3/4069 174/254 |
| 2017/0318674 | A1* | 11/2017 | Kaibuki | H05K 1/028 |

FOREIGN PATENT DOCUMENTS

| | | |
|---|---|---|
| JP | 2005-236220 A | 9/2005 |
| KR | 10-0834591 B1 | 6/2008 |
| KR | 2009-0044023 A | 5/2009 |
| KR | 10-2015-0127823 A | 11/2015 |

\* cited by examiner

SUBSTRATE AND METHOD FOR MANUFACTURING THE SAME

CROSS-REFERENCE TO RELATED APPLICATION(S)

This application claims the benefit under 35 U.S.C. 119(a) of Korean Patent Application No. 10-2017-0021721 filed on Feb. 17, 2017 in the Korean Intellectual Property Office, the entire disclosure of which is incorporated herein by reference for all purposes.

BACKGROUND

1. Field

The following description relates to a substrate and a method of manufacturing the same.

2. Description of Related Art

As a hole processing method for interlayer electrical connection of a substrate, a mechanical processing method using tools, and a processing method using a laser, have generally been used. Meanwhile, due to the densification and miniaturization of substrates in recent times, a small diameter of a hole has been constantly required.

In addition, the hole processing method using a laser may be provided as a method of forming a blind and a buried via hole (BVH), in which one side of the hole is blocked, and a method of a plated trough hole (PTH) passing through. In addition, a through hole formed by laser processing, among through holes formed in PTH methods, is referred to as a laser through hole (LTH).

Meanwhile, when a LTH is generally formed, a laser beam is irradiated in a direction from one surface to the other surface of a substrate, so that a hole portion is formed. While the substrate is upside down, a laser beam is irradiated in a direction from the one surface to the other surface of the substrate, so that the remainder of the hole is formed.

However, due to differences in thermal conductivity and a laser absorption rate between a core layer and a metal layer of the substrate, a size of an opening of the core layer may be further increased, so a defect in which the core layer and the metal layer may be partially separated at an interface therebetween may occur.

In addition, a problem in which a through hole is formed toward both surfaces of the substrate, so a manufacturing yield decreases, may occur.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples provide a substrate with improved manufacturing yield and reduced defect occurrence, and a method of manufacturing the same.

In one general aspect, a method of manufacturing a substrate includes: forming a through hole in a substrate only in one of a direction from a top surface to a bottom surface of the substrate or a direction from a bottom surface to a top surface of the substrate; removing a protruding portion of a metal layer provided in the substrate, protruding toward the through hole; and forming a plating layer on an inner surface of the substrate forming at least the through hole.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depictions of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Subsequently, examples are described in further detail with reference to the accompanying drawings.

Figure 1:
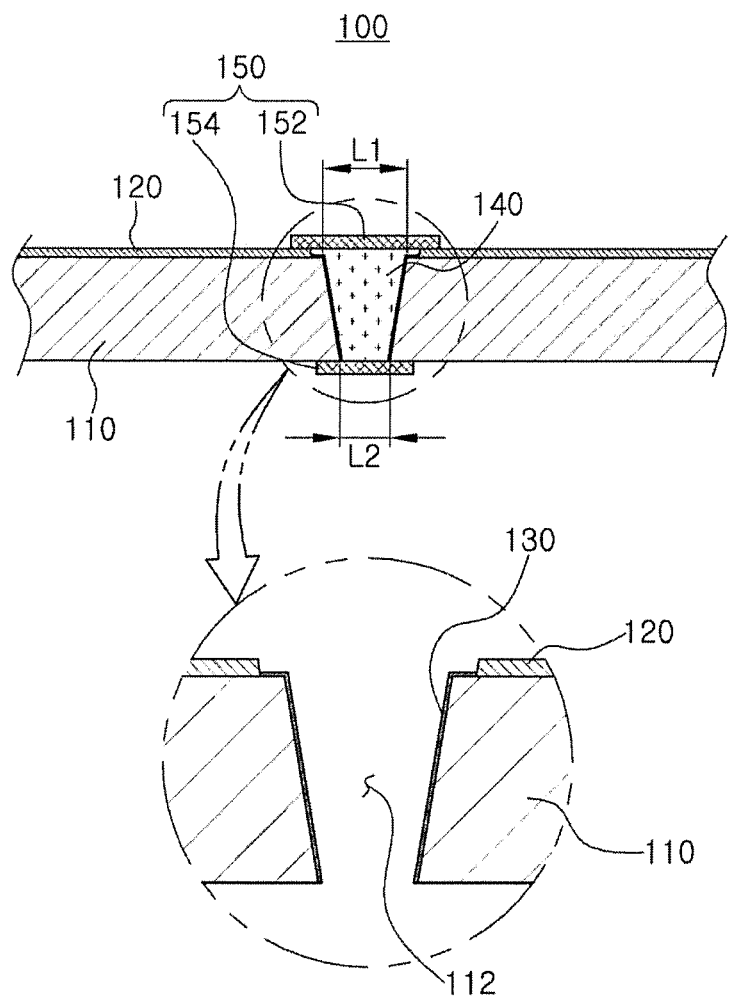
FIG. 1 shows a schematic cross-sectional view illustrating a substrate according to a first example.

FIG. 1 is a schematic cross-sectional view illustrating a substrate according to a first example.

Referring to FIG. 1, a substrate 100 according to a first example includes, by way of example, a core layer 110, a metal layer 120, a plating layer 130, a via 140, and a connection pad 150.

The core layer 110 may be formed of an insulating material. For example, the core layer 110 may be formed of, for example, a thermosetting resin such as an epoxy resin, a thermoplastic resin such as polyimide, or a resin impregnated with a reinforcing material such as a glass fiber or an inorganic filler, for example, prepreg, an ajinomoto build-up film (ABF), FR-4, a bismaleimide triazine (BT) resin, or the like, but an example is not limited thereto.

The core layer 110 may have a metal with excellent rigidity and thermal conductivity disposed therein. In this case, the metal may be a Fe—Ni-based alloy, and Cu plating may be formed on a surface of the Fe—Ni-based alloy. In addition, other glass, ceramic, plastic, or the like may be disposed therein.

Meanwhile, a through hole 112 may be formed in the core layer 110. The through hole 112 may be formed by irradiating a laser beam only in one of a direction from one surface to the other surface or a direction from the other surface to one surface of the core layer 110.

As described above, the through hole 112 is formed by irradiating a laser beam only in a single direction, so the processing time may be shortened, and further productivity may be improved.

Further, the through hole 112 is formed by irradiating a laser beam only in a single direction, so a defect of processing precision may be reduced.

In addition, the through hole 112 may be formed to be tapered. By way of example, the through hole 112 may be formed to have a diameter L1 at one end, greater than a diameter L2 at the other end.

The metal layer 120 may be formed on at least one of one surface and the other surface of the core layer 110. By way of example, the metal layer 120 is formed on one surface of the core layer 110. In addition, the through hole 112 may be formed in a direction from the metal layer 120 to the core layer 110 as described above.

The metal layer 120 may contain at least one material selected from the group consisting of silver (Ag), palladium (Pd), aluminum (Al), nickel (Ni), titanium (Ti), gold (Au), copper (Cu), platinum (Pt), and the like, with excellent conductivity or mixtures of at least two materials.

The metal layer 120 may be formed using a known method, for example, in electrolytic copper plating, electroless copper plating, or the like. In detail, the metal layer may be formed in a method such as chemical vapor deposition (CVD), physical vapor deposition (PVD), sputtering, a subtractive, additive or semi-additive process (SAP), a modified semi-additive process (MSAP), or the like, but an example is not limited thereto.

Further, the metal layer 120 may be disposed not to protrude inwardly of the through hole 112. In other words, the metal layer 120, having not been removed, protrudes toward the through hole 112 after the through hole 112 is formed, and is then removed in an etching process.

Thus, the occurrence of a defect, occurring as a diameter of the through hole 112 is reduced due to the metal layer 120, may be reduced.

The plating layer 130 may be formed on an inner surface of the core layer 110 forming at least the through hole 112. By way of example, the plating layer 130 may be formed on an upper surface of the core layer 110 disposed to surround the through hole 112, and an inner surface of the core layer 110 forming the through hole 112.

In addition, the plating layer 130 may be formed of, by way of example, one of Cu or Ni or alloys containing one thereof.

Further, the plating layer 130 may be formed by, by way of example, electroplating due to chemical plating.

The via 140 is filled in the through hole 112 and may be formed of a conductive material. In addition, the connection pad 150 may be connected to at least one of one end and the other end of the via 140. By way of example, the connection pad 150 may be provided as a first connection pad 152 connected to one end of the via 140, and a second connection pad 154 connected to the other end of the via 140.

Meanwhile, as described above, the diameter L1 at one end of the through hole 112 is formed to be greater than the diameter L2 at the other end thereof, so a size of the first connection pad 152 is formed to be greater than a size of the second connection pad 154.

As described above, sizes of the first connection pad 152 and the second connection pad 154 may be formed to be different, for example, the second connection pad 154 may be formed to be smaller than the first connection pad 152, so a size of a connection pad formed in a portion requiring a high-density circuit may be reduced.

As described above, the through hole 112 is formed by irradiating a laser beam only in a single direction, so the processing time may be shortened, and further productivity may be improved.

Further, the through hole 112 is formed by only irradiating a laser beam in a single direction, so a defect of processing precision may be reduced.

In addition, the occurrence of a defect, occurring as a diameter of the through hole 112 is reduced due to the metal layer 120, may be reduced.

In addition, sizes of the first connection pad 152 and the second connection pad 154 may be formed to be different from each other, for example, the second connection pad 154 may be formed to be smaller than the first connection pad 152, so a size of a connection pad formed in a portion requiring a high-density circuit may be reduced.

Hereinafter, a method of manufacturing a substrate according to a first example will be described with reference to the drawings.

FIGS. 2 through 6 are process flow diagrams illustrating a method of manufacturing a substrate according to a first example.

Figure 2:
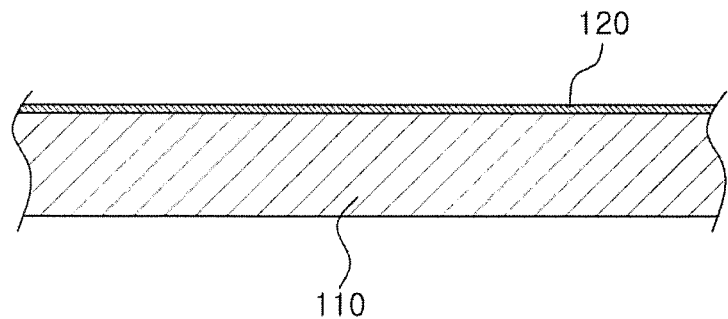
FIGS. 2, 3, 4, 5, and 6 show process flow diagrams illustrating a method of manufacturing a substrate according to a first example.

As illustrated in FIG. 2, the substrate 100 in which the metal layer 120 is formed on one surface of the core layer 110 is prepared.

The core layer 110 may be formed of, for example, a thermosetting resin such as an epoxy resin, a thermoplastic resin such as polyimide, or a resin impregnated with a reinforcing material such as a glass fiber or an inorganic filler, for example, prepreg, an ajinomoto build-up film (ABF), FR-4, a bismaleimide triazine (BT) resin. In addition, the metal layer 120 may be formed of a material containing at least one material selected from the group consisting of silver (Ag), palladium (Pd), aluminum (Al), nickel (Ni), titanium (Ti), gold (Au), copper (Cu), platinum (Pt), and the like, having excellent conductivity, or mixtures of at least two materials.

Figure 3:
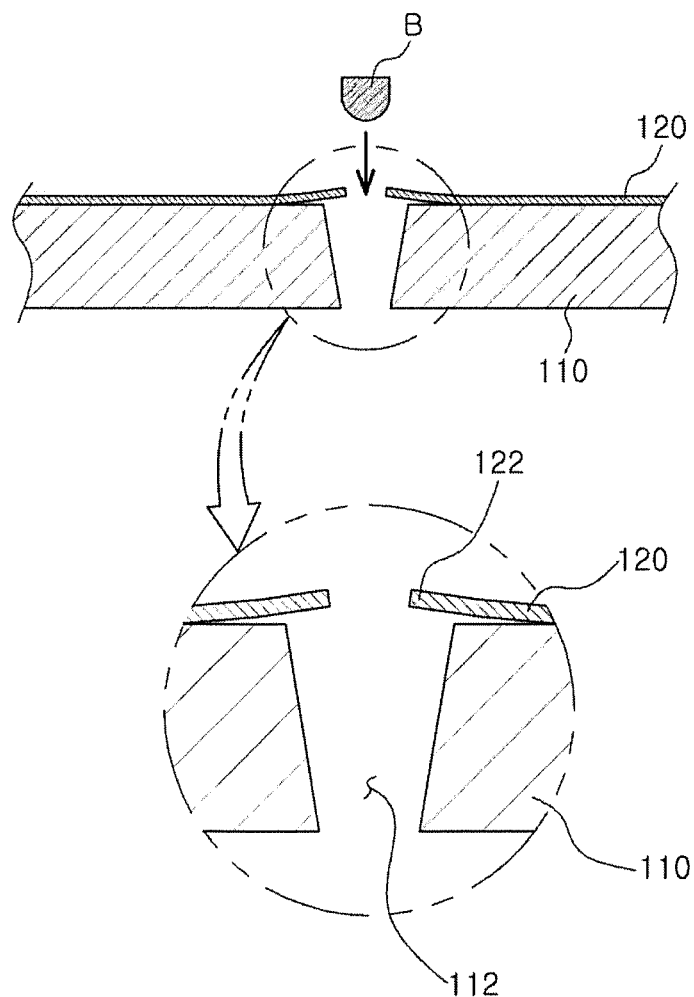

Thereafter, as illustrated in FIG. 3, the through hole 112 is formed by irradiating a laser beam B to the substrate 100. By way of example, the laser beam B is irradiated in a direction from one surface having the metal layer 120 to the other surface the core layer 110, so that the through hole 112 is formed in the substrate 100.

As described above, when the through hole 112 is formed in the substrate 100 by irradiating the laser beam B, due to differences in thermal conductivity and a laser absorption rate between the core layer 110 and the metal layer 120, a size of an opening of the core layer 110 is further increased, as compared to that of the metal layer 120, so a defect in which the core layer 110 and the metal layer 120 may be partially separated at an interface therebetween may occur.

Figure 4:
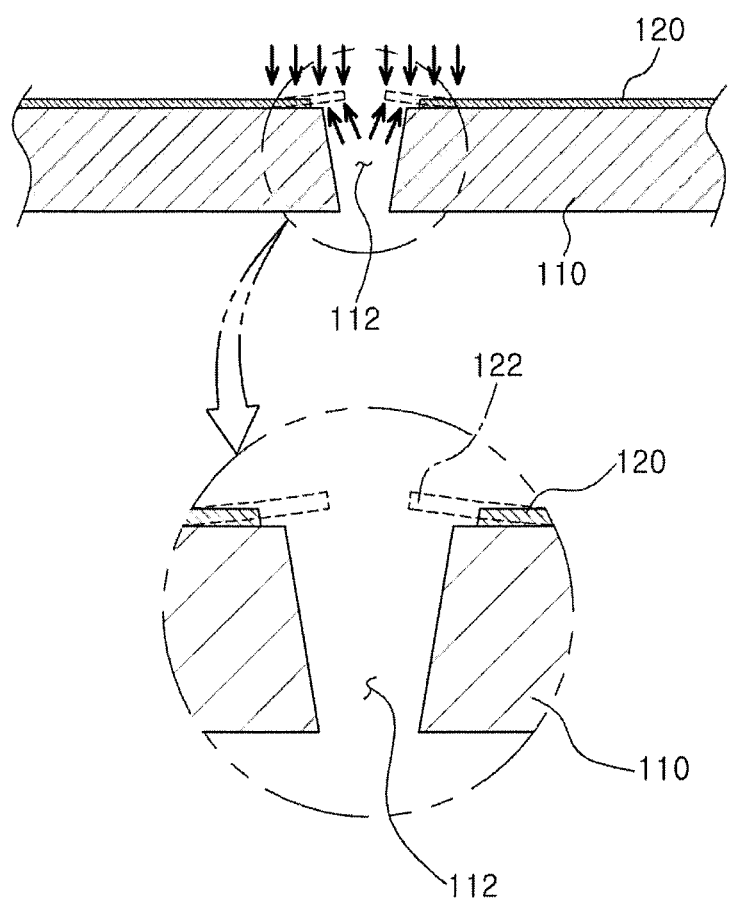

Thereafter, as illustrated in FIG. 4, a protruding portion 122 of the metal layer 120 protruding toward the through hole 112 may be removed by etching. Thus, a thickness of the metal layer 120 is thinner than an initial thickness thereof while the protruding portion 122 of the metal layer 120 is removed.

Figure 5:
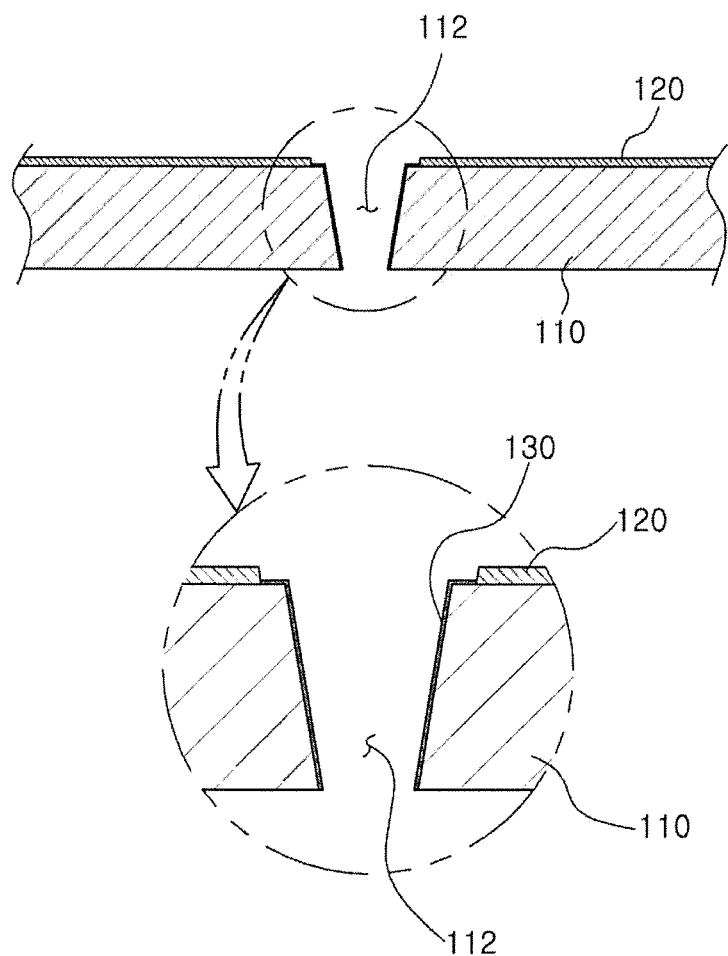

Thereafter, as illustrated in FIG. 5, the plating layer 130 is formed on an upper surface of the core layer 110 disposed to surround the through hole 112 and an inner surface of the core layer 110 by plating. The plating layer 130 may be formed of, by way of example, one of Cu or Ni or alloys thereof.

Further, the plating layer 130 may be formed by, by way of example, electroplating or chemical plating.

Figure 6:
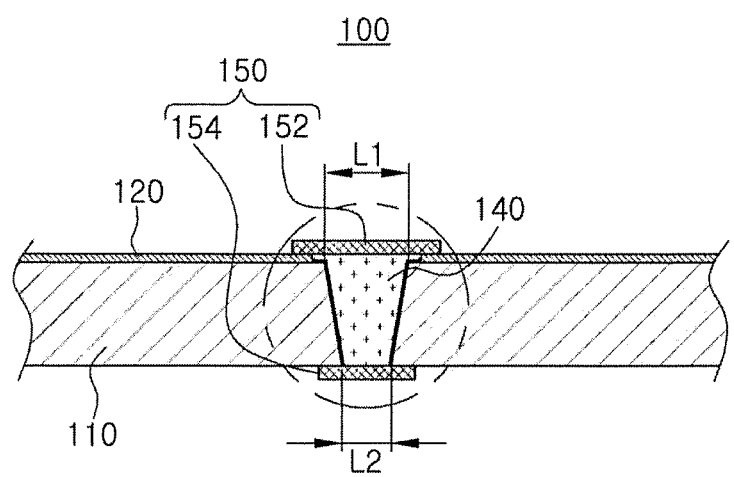

Thereafter, as illustrated in FIG. 6, the via 140 is formed in the through hole 112, and the first connection pad 152 connected to one end of the via 140 and the second connection pad 154 connected to the other end of the via 140 are formed.

Meanwhile, the diameter L1 at one end of the through hole 112 is formed to be greater than the diameter L2 at the other end thereof, so a size of the first connection pad 152 is formed to be greater than a size of the second connection pad 154.

As described above, the through hole 112 is formed by only irradiating a laser beam in a single direction, so the processing time may be shortened, and further productivity may be improved.

Further, the through hole 112 is formed by only irradiating a laser beam in a single direction, so that a defect of processing precision may be reduced.

In addition, the occurrence of a defect, occurring as a diameter of the through hole 112 is reduced due to the through hole 112 of the metal layer 120 in an etching process, may be reduced.

In addition, sizes of the first connection pad 152 and the second connection pad 154 may be formed to be different from each other, for example, the second connection pad 154 may be formed to be smaller than the first connection pad 152, so a size of a connection pad formed in a portion requiring a high-density circuit may be reduced.

Figure 7:
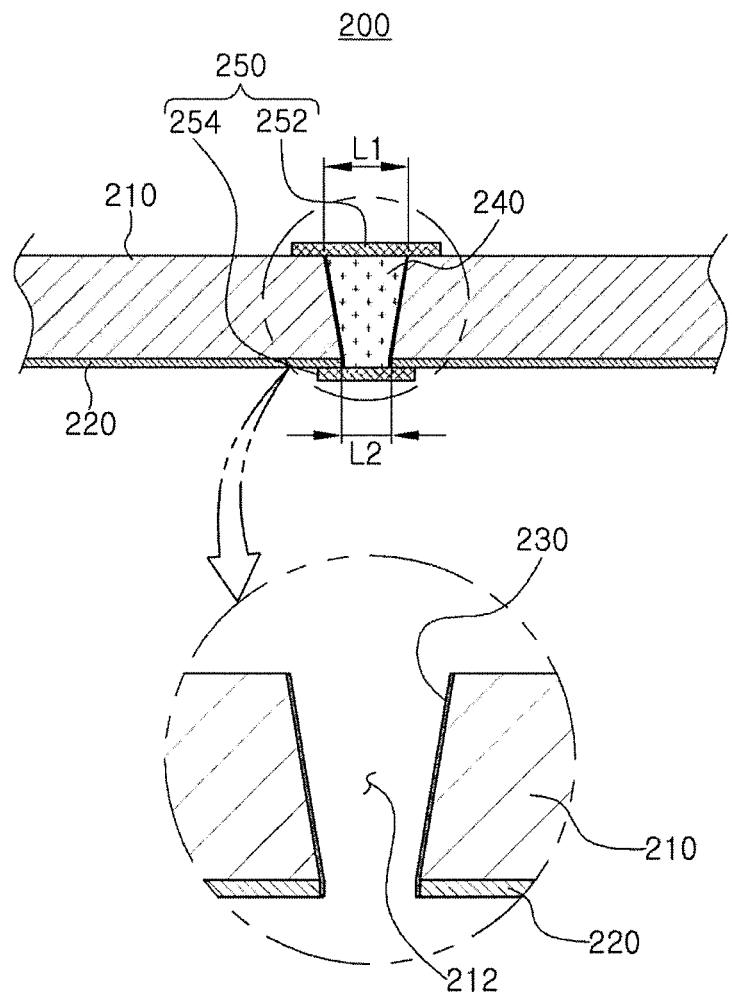
FIG. 7 shows a schematic cross-sectional view illustrating a substrate according to a second example.

FIG. 7 is a schematic cross-sectional view illustrating a substrate according to a second example.

Referring to FIG. 7, a substrate 200 according to a second example includes, by way of example, a core layer 210, a metal layer 220, a plating layer 230, a via 240, and a connection pad 250.

The core layer 210 may be formed of an insulating material. For example, the core layer 210 may be formed of, for example, a thermosetting resin such as an epoxy resin, a thermoplastic resin such as polyimide, or a resin impregnated with a reinforcing material such as glass fiber or inorganic filler, for example, prepreg, an ajinomoto build-up film (ABF), FR-4, a bismaleimide triazine (BT) resin, or the like, but an example is not limited thereto.

The core layer 210 may have a metal with excellent rigidity and thermal conductivity disposed therein. In this case, the metal may be a Fe—Ni-based alloy, and Cu plating may be formed on a surface of the Fe—Ni-based alloy. In addition, glass, ceramic, plastic, or the like may be disposed therein.

Meanwhile, a through hole 212 may be formed in the core layer 210. The through hole 212 may be formed by irradiating a laser beam only in one of a direction from one surface to the other surface or a direction from the other surface to one surface of the core layer 210.

As described above, the through hole 212 is formed by irradiating a laser beam only in a single direction, so the processing time may be shortened, and further productivity may be improved.

Further, the through hole 212 is formed by irradiating a laser beam only in a single direction, so that a defect of processing precision may be reduced.

In addition, the through hole 212 may be formed to be tapered. By way of example, the through hole 212 may be formed to have a diameter L1 at one end greater than a diameter L2 at the other end.

The metal layer 220 may be formed on at least one surface of one surface and the other surface of the core layer 210. By way of example, the metal layer 220 is formed on the other surface of the core layer 210. In addition, the through hole 112 may be formed in a direction from the core layer 210 to the metal layer 220 as described above. In other words, the through hole 212 may be formed in a direction from one surface to the other surface of the core layer 210 by irradiating a laser beam.

The metal layer 220 may contain at least one material selected from the group consisting of Ag, Pd, Al, Ni, Ti, Au, Cu, Pt, and the like, with excellent conductivity or mixtures of at least two materials.

The metal layer 220 may be formed in a known method, for example, in electrolytic copper plating, or electroless copper plating, or the like. In detail, the metal layer may be formed using chemical vapor deposition (CVD), physical vapor deposition (PVD), pulsed laser deposition, a sputtering, subtractive, additive or semi-additive process (SAP), a modified semi-additive process (MSAP), or the like, but an example is not limited thereto.

Further, the metal layer 220 may be disposed not to protrude inwardly of the through hole 212. In other words, the metal layer 220, not having been removed, protrudes toward the through hole 212 after the through hole 212 is formed, and is then removed in an etching process.

Thus, the occurrence of a defect, occurring as a diameter of the through hole 212 is reduced due to the metal layer 220, may be reduced.

The plating layer 230 may be formed on an inner surface of the core layer 210 forming at least the through hole 212. By way of example, the plating layer 230 may be formed on the inner surface of the core layer 210 forming the through hole 212.

In addition, the plating layer 230 may be formed of, by way of example, one of Cu or Ni or alloys containing one thereof.

Further, the plating layer 230 may be formed by, by way of example, electroplating due to chemical plating.

The via 240 is filled in the through hole 212 and may be formed of a conductive material. In addition, the connection pad 250 may be connected to at least one of one end and the other end of the via 240. By way of example, the connection pad 250 may be provided as a first connection pad 252 connected to one end of the via 240, and a second connection pad 254 connected to the other end of the via 240.

Meanwhile, as described above, the diameter L1 at one end of the through hole 212 is formed to be greater than the diameter L2 at the other end thereof, so a size of the first connection pad 252 is formed to be greater than a size of the second connection pad 254.

As described above, sizes of the first connection pad 252 and the second connection pad 254 may be formed to be different from each other, for example, the second connection pad 254 may be formed to be smaller than the first connection pad 252, so a size of a connection pad formed in a portion requiring a high-density circuit may be reduced.

As described above, the through hole 212 is formed by irradiating a laser beam only in a single direction, so the processing time may be shortened, and further productivity may be improved.

Further, the through hole 212 is formed by irradiating a laser beam only in a single direction, so that a defect of processing precision may be reduced.

In addition, the occurrence of a defect, occurring as a diameter of the through hole 112 is reduced due to the metal layer 120, may be reduced.

In addition, sizes of the first connection pad 252 and the second connection pad 254 may be formed to be different from each other, for example, the second connection pad 254 may be formed to be smaller than the first connection pad 252, so a size of a connection pad formed in a portion requiring a high-density circuit may be reduced.

Hereinafter, a method of manufacturing a substrate according to a second example will be described with reference to the drawings.

FIGS. 8 through 12 are process flow diagrams illustrating a method of manufacturing a substrate according to a second example.

Figure 8:
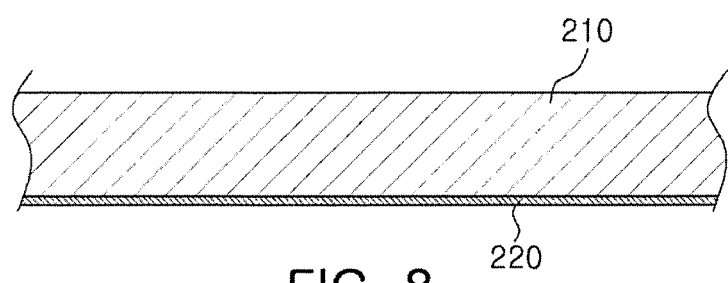
FIGS. 8, 9, 10, 11, and 12 show process flow diagrams illustrating a method of manufacturing a substrate according to a second example.

As illustrated in FIG. 8, the substrate 200 in which the metal layer 220 is formed on the other surface of the core layer 210.

For example, the core layer 210 may be formed of, for example, a thermosetting resin such as an epoxy resin, a thermoplastic resin such as polyimide, or a resin impregnated with a reinforcing material such as a glass fiber or an inorganic filler, for example, prepreg, an ajinomoto build-up film (ABF), FR-4, a bismaleimide triazine (BT) resin. In addition, the metal layer 220 may be formed of a material containing at least one material selected from the group consisting of Ag, Pd, Al, Ni, Ti, Au, Cu, Pt, and the like, with excellent conductivity or mixtures of at least two materials.

Figure 9:
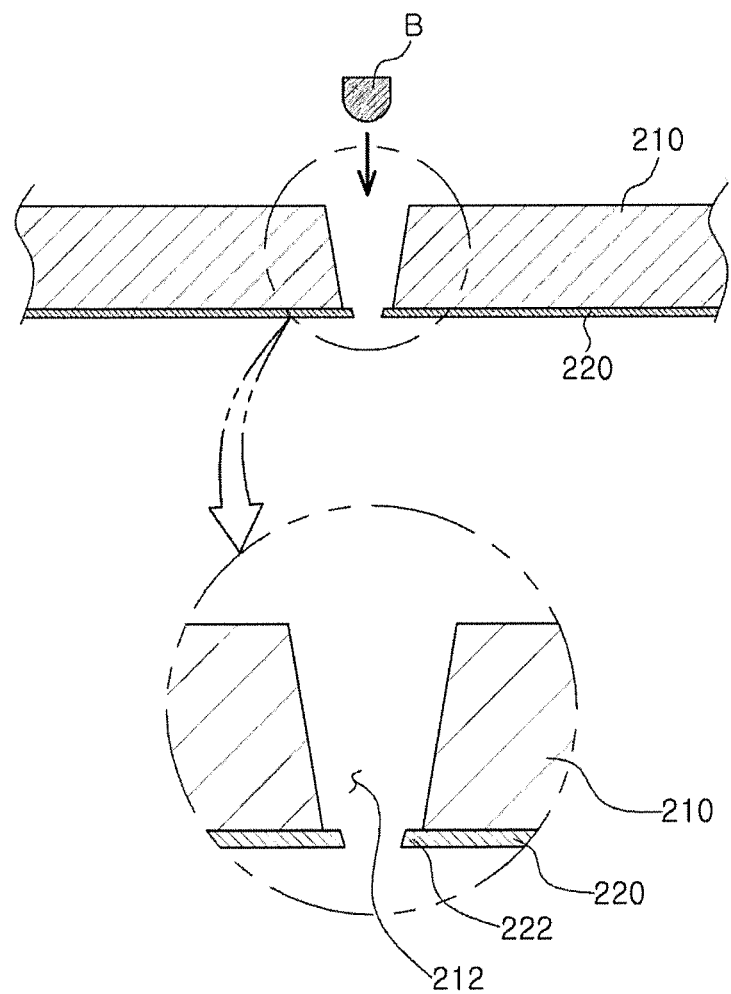

Thereafter, as illustrated in FIG. 9, the through hole 212 is formed by irradiating a laser beam B to the substrate 200. By way of example, the laser beam B is irradiated in a direction from one surface of the core layer 210 to the other surface of the core layer 210 having the metal layer 220 formed therein, so that the through hole 212 is formed in the substrate 200.

As described above, when the through hole 212 is formed in the substrate 200 by irradiating the laser beam B, due to differences in thermal conductivity and a laser absorption rate between the core layer 210 and the metal layer 220, a size of an opening of the core layer 210 is further increased compared to that of the metal layer 220, so the other end of the through hole 212 is not completely open due to the metal layer 220. In other words, a protruding portion 222 disposed inwardly of the through hole 212 is provided in the metal layer 220.

Figure 10:
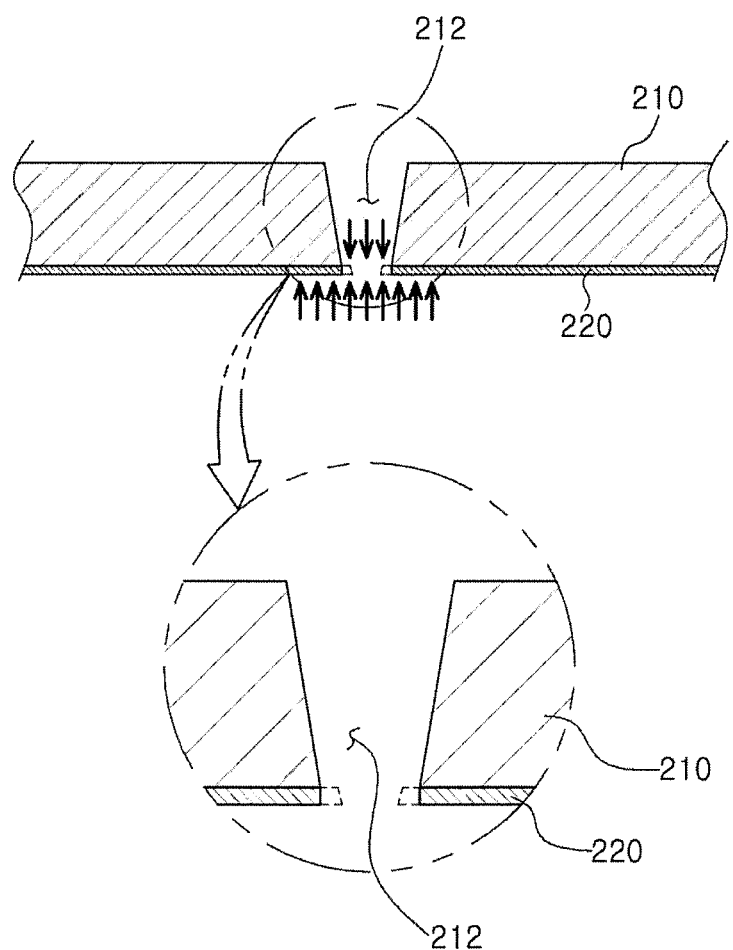

Thereafter, as illustrated in FIG. 10, the protruding portion 222 of the metal layer 220 protruding toward the through hole 212 may be removed by etching. Thus, a thickness of the metal layer 220 is thinner than an initial thickness thereof while the protruding portion 222 of the metal layer 220 is removed.

Figure 11:
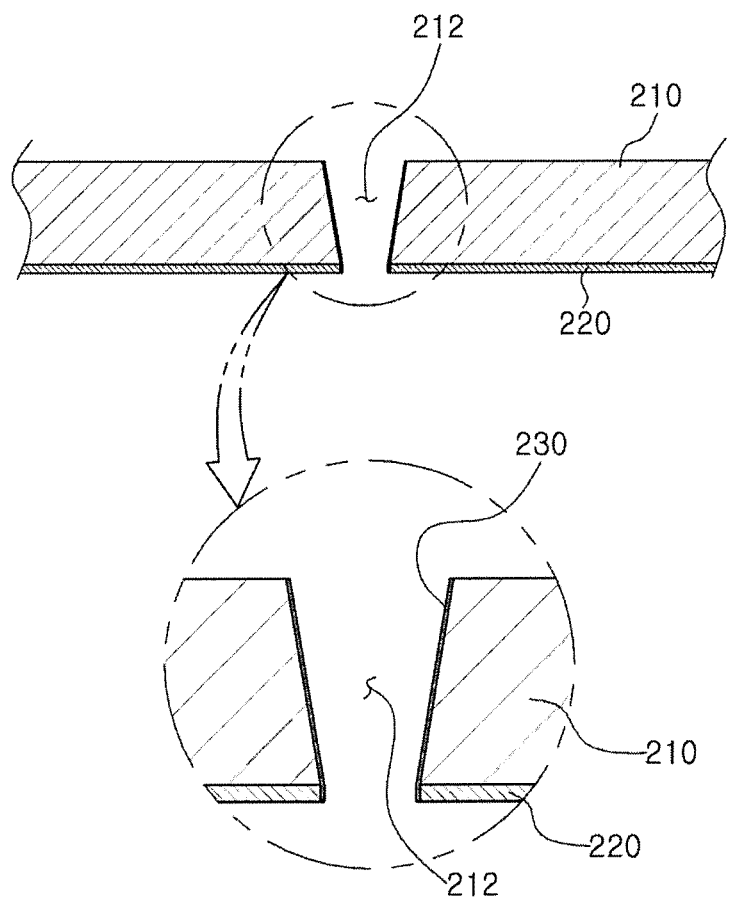

Thereafter, as illustrated in FIG. 11, the plating layer 230 is formed on an inner surface of the core layer 210. The plating layer 230 may be formed of, by way of example, one of Cu or Ni or alloys containing one thereof.

Further, the plating layer 230 may be formed by, by way of example, electroplating due to chemical plating.

Figure 12:
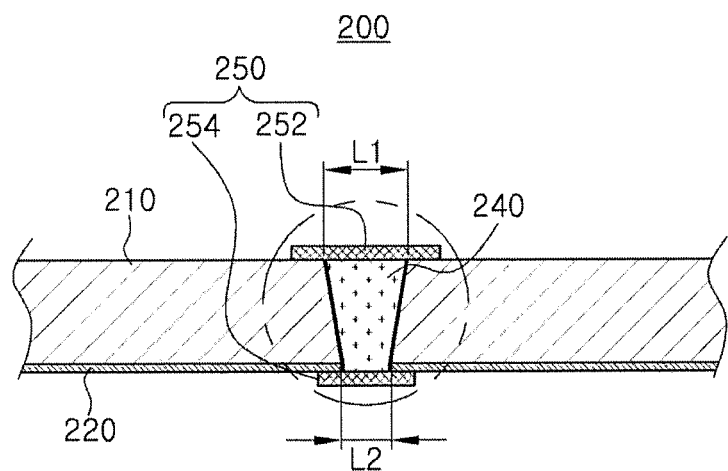

Thereafter, as illustrated in FIG. 12, the via 240 is formed in the through hole 212, and the first connection pad 252 connected to one end of the via 240 and the second connection pad 254 connected to the other end of the via 240 are formed.

Meanwhile, the diameter L1 at one end of the through hole 212 is formed to be greater than the diameter L2 at the other end thereof, so a size of the first connection pad 252 is formed to be greater than a size of the second connection pad 254.

As described above, the through hole 212 is formed by only irradiating a laser beam in a single direction, so the processing time may be shortened, and further productivity may be improved.

Further, the through hole 212 is formed by irradiating a laser beam only in a single direction, so that a defect of processing precision may be reduced.

In addition, the occurrence of a defect, occurring as a diameter of the through hole 212 is reduced by the through hole 222 of the metal layer 220 in an etching process, may be reduced.

In addition, sizes of the first connection pad 252 and the second connection pad 254 may be formed to be different from each other, for example, the second connection pad 254 may be formed to be smaller than the first connection pad 252, so a size of a connection pad formed in a portion requiring a high-density circuit may be reduced.

As set forth above, according to examples, manufacturing yield may be improved and defect occurrence may be reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A substrate, comprising:
 a core layer having a tapered through hole extending therethrough between first and second opposing surfaces thereof, the tapered through hole having a first diameter opening at one end thereof, in one surface of the first and second opposing surfaces, larger than a second diameter opening at another end thereof, in another surface of the first and second opposing surfaces;
 a plating layer disposed on an inner surface of the tapered through hole of the core layer and on only the one surface, from among the first and second opposing surfaces, having the first diameter opening of the through hole;
 a metal layer disposed on only the one surface, from among the first and second opposing surfaces of the core layer, having the first diameter opening of the through hole, and the metal layer having an opening aligned with the through hole and having a width greater than a width of the through hole such that the metal layer is spaced apart from the through hole and in contact with the plating layer disposed on the one surface;

a via disposed in the through hole; and first and second connection pads distinct from the metal layer, disposed on opposing ends of the via, and each extending externally from a respective one of the first and second opposing surfaces of the core layer.

2. The substrate of claim 1, wherein sizes of the first and second connection pads are different from each other.

3. The substrate of claim 1, wherein the metal layer is formed of a material including at least one material selected from the group consisting of silver (Ag), palladium (Pd), aluminum (Al), nickel (Ni), titanium (Ti), gold (Au), copper (Cu), platinum (Pt), and the like, or mixtures of at least two materials.

4. The substrate of claim 1, wherein the plating layer is disposed on the one surface of the core layer, and the other surface of the core layer is free of any conductive layer other than the connection pads.

5. The substrate of claim 1, wherein the size of the second connection pad disposed externally from the other surface is smaller than the size of the first connection pad disposed externally from the one surface.

6. The substrate of claim 1, wherein the connection pad, of the first and second connection pads, that is disposed to extend externally from the one surface extends externally from the metal layer.

7. The substrate of claim 1, wherein the connection pad, of the first and second connection pads, that is disposed externally from the surface other surface of the core layer has a diameter greater than that of the second diameter opening.

8. The substrate of claim 7, wherein the connection pad, of the first and second connection pads, that is disposed externally from the one surface of the first and second opposing surfaces of the core layer has a diameter greater than that of the first diameter opening.

9. The substrate of claim 1, wherein a thickness of the metal layer on the one surface is greater than a thickness of the plating layer on the one surface.

10. The substrate of claim 1, wherein one of the first and second connection pads is disposed externally from the metal layer, and has a width greater than the width of the opening in the metal layer so as to extend across the opening in the metal layer.

* * * * *